United States Patent
Choi et al.

(10) Patent No.: US 8,748,897 B2
(45) Date of Patent: Jun. 10, 2014

(54) ARRAY SUBSTRATE FOR ORGANIC ELECTROLUMINESCENT DISPLAY DEVICE

(71) Applicant: LG Display Co., Ltd., Seoul (KR)

(72) Inventors: Hee-Dong Choi, Seosan-si (KR); Seung-Joon Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/077,937

(22) Filed: Nov. 12, 2013

(65) Prior Publication Data

US 2014/0061657 A1 Mar. 6, 2014

Related U.S. Application Data

(62) Division of application No. 13/339,097, filed on Dec. 28, 2011, now Pat. No. 8,603,845.

(30) Foreign Application Priority Data

Jul. 7, 2011 (KR) .......................... 10-2011-0067499

(51) Int. Cl.
*H01L 27/088* (2006.01)
*H01L 29/786* (2006.01)

(52) U.S. Cl.
USPC ......... 257/59; 257/72; 257/347; 257/E29.273

(58) Field of Classification Search
USPC .............................................. 257/59, 72, 347
See application file for complete search history.

(56) References Cited

U.S. PATENT DOCUMENTS

| 7,274,039 | B2 * | 9/2007 | Park ................................. 257/72 |
| 7,858,974 | B2 * | 12/2010 | Yoon et al. ....................... 257/40 |
| 8,587,194 | B2 * | 11/2013 | Lee et al. ......................... 313/505 |
| 2007/0152222 | A1 * | 7/2007 | Joo ................................... 257/72 |
| 2011/0266547 | A1 * | 11/2011 | Cho et al. ......................... 257/59 |
| 2012/0319124 | A1 * | 12/2012 | Kim et al. ......................... 257/72 |
| 2013/0113044 | A1 * | 5/2013 | Yamazaki et al. ............. 257/347 |

* cited by examiner

*Primary Examiner* — Thanh Nguyen
(74) *Attorney, Agent, or Firm* — Brinks Gilson & Lione

(57) ABSTRACT

An array substrate for an organic electroluminescent display device includes a substrate including a display area and a non-display area; a gate line and a data line; a thin film transistor including a semiconductor layer of polycrystalline silicon, a gate insulating layer, a gate electrode, an inter insulating layer, a source electrode, and a drain electrode; auxiliary lines formed of a same material and on a same layer as the data line; a passivation layer of organic insulating material and including a drain contact hole exposing the drain electrode, and an auxiliary line contact hole exposing one of the auxiliary lines; and a first electrode and a line connection pattern on the passivation layer, wherein the first electrode contacts the drain electrode and the line connection pattern contacts the one of the first auxiliary pattern.

10 Claims, 18 Drawing Sheets

ARRAY SUBSTRATE FOR ORGANIC ELECTROLUMINESCENT DISPLAY DEVICE

This application is a divisional application of U.S. application Ser. No. 13/339,097 which was filed on Dec. 28, 2011, which claims the priority and the benefit under 35 U.S.C. §119(a) on Korean Patent Application No. 10-2011-0067499, filed in Korea on Jul. 7, 2011, the entire contents of which are hereby incorporated by reference.

BACKGROUND

1. Field of the Invention

The present disclosure relates to an array substrate for an organic electroluminescent display device, and more particularly, to an array substrate for an organic electroluminescent display device that includes a thin film transistor having polycrystalline silicon as a semiconductor layer and a method of fabricating the same.

2. Discussion of the Related Art

With rapid development of information technologies, display devices for displaying a large amount of information have been promptly developed. Recently, flat panel display (FPD) devices having a thin profile, light weight and low power consumption have been suggested and actively pursued.

Among these, organic electroluminescent display devices have been recently spotlighted because they have many merits as follows: organic electroluminescent display devices have high brightness and low driving voltages; because they are self-luminous, the organic electroluminescent display devices have excellent contrast ratios and ultra thin thicknesses; the organic electroluminescent display devices have response time of several micro seconds, and there are advantages in displaying moving images; the organic electroluminescent display devices have wide viewing angles and are stable under low temperatures; since the organic electroluminescent display devices are driven by low voltage of direct current (DC) 5V to 15V, it is easy to design and manufacture driving circuits; and a manufacturing process of an organic electroluminescent display device is very simple because substantially only deposition and encapsulation apparatus is required. In the organic electroluminescent display devices, active matrix type display devices have been widely An organic electroluminescent display device includes an array substrate on which thin film transistors for turning on/off respective pixel regions are formed. Thin film transistors may have polycrystalline silicon as a semiconductor layer. An array substrate for an organic electroluminescent display device including polycrystalline silicon thin film transistors, generally, is fabricated through 10 mask processes: forming a semiconductor layer of polycrystalline silicon, forming a first storage electrode; forming a gate electrode; forming an inter insulating layer having a semiconductor contact hole; forming source and drain electrodes; forming a first passivation layer of inorganic insulating material; forming a second passivation layer of organic insulating material; forming an anode electrode; forming a bank; and forming a spacer.

After forming a material layer on a substrate, a mask process includes steps of forming a photoresist layer on the material layer, exposing the photoresist layer to light through a photo mask, developing the light-exposed photoresist layer to form a photoresist pattern, etching the material layer using the photoresist pattern as a mask, and stripping the photoresist pattern.

Therefore, to perform one mask process, apparatus and materials for each step are needed, and time for each step is also required. In manufacturing an organic electroluminescent display device, trials and efforts for reducing the mask processes have been made to reduce the manufacturing costs and to improve the productivity. A method of skipping one of the first and second passivation layers has been suggested, and in this case, there may be disconnection between signal lines or connection patterns.

BRIEF SUMMARY

An array substrate for an organic electroluminescent display device includes a substrate including a display area and a non-display area, wherein the display area includes a pixel region and the non-display area includes a power source area; a gate line and a data line formed with an inter insulating layer therebetween and crossing each other to define the pixel region; a thin film transistor formed in a driving area of the pixel region and including a semiconductor layer of polycrystalline silicon, a gate insulating layer, a gate electrode, the inter insulating layer, a source electrode, and a drain electrode; auxiliary lines formed of a same material and on a same layer as the data line in the power source area; a passivation layer disposed on the thin film transistor and formed of organic insulating material, wherein the passivation layer has a drain contact hole exposing the drain electrode and an auxiliary line contact hole exposing one of the auxiliary lines in the power source area, wherein the passivation layer covers ends and/or sides of the one of the auxiliary lines; and a first electrode and a line connection pattern on the passivation layer in the pixel region and in the power source area, respectively, wherein the first electrode contacts the drain electrode and the line connection pattern contacts the one of the first auxiliary pattern.

In another aspect, a method of fabricating an array substrate for an organic electroluminescent display device includes preparing a substrate including a display area and a non-display area, wherein the display area includes a pixel region and the non-display area includes a power source area; forming a gate line and a data line with an inter insulating layer therebetween, the gate line and the data line crossing each other to define the pixel region; forming a thin film transistor in a driving area of the pixel region, the thin film transistor including a semiconductor layer of polycrystalline silicon, a gate insulating layer, a gate electrode, the inter insulating layer, a source electrode, and a drain electrode; forming auxiliary lines of a same material and on a same layer as the data line in the power source area; forming a passivation layer on the thin film transistor and of organic insulating material, wherein the passivation layer has a drain contact hole exposing the drain electrode and an auxiliary line contact hole exposing one of the auxiliary lines in the power source area, wherein the passivation layer covers ends and/or sides of the one of the auxiliary lines; and forming a first electrode and a line connection pattern on the passivation layer in the pixel region and in the power source area, respectively, wherein the first electrode contacts the drain electrode and the line connection pattern contacts the one of the first auxiliary pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incor

DETAILED DESCRIPTION OF THE DRAWINGS AND THE PRESENTLY PREFERRED EMBODIMENTS

Reference will now be made in detail to embodiments of the present invention, examples of which are illustrated in the accompanying drawings.

FIGS. 1A to 1M are cross-sectional views of illustrating a pixel region of an array substrate for an organic electroluminescent display device in steps of fabricating the same according to a first embodiment of the present invention. FIGS. 2A to 2M are cross-sectional views of illustrating a non-display area of the array substrate for an organic electroluminescent display device in steps of fabricating the same according to the first embodiment of the present invention. For convenience of explanation, in each pixel region P, an area where a thin film transistor is formed is defined as a driving area DA, and an area where a storage capacitor is formed is defined as a storage area StgA.

The thin film transistor in the driving area DA functions as a driving thin film transistor connected to an organic light-emitting diode, and although not shown in the figures, a switching thin film transistor having the same structure as the driving thin film transistor is formed and is connected to a gate line and a data line.

Figure 1A:
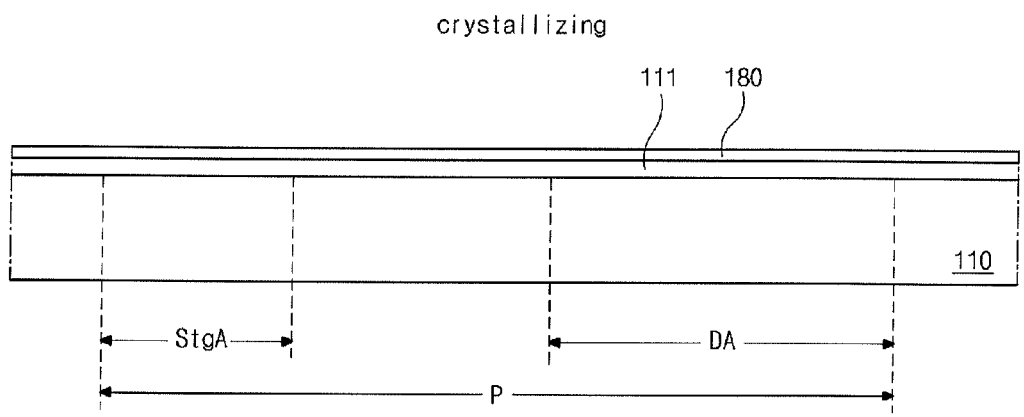
- FIGS. 1A to 1M are cross-sectional views of illustrating a pixel region of an array substrate for an organic electroluminescent display device in steps of fabricating the same according to a first embodiment of the present invention.
Figure 2A:
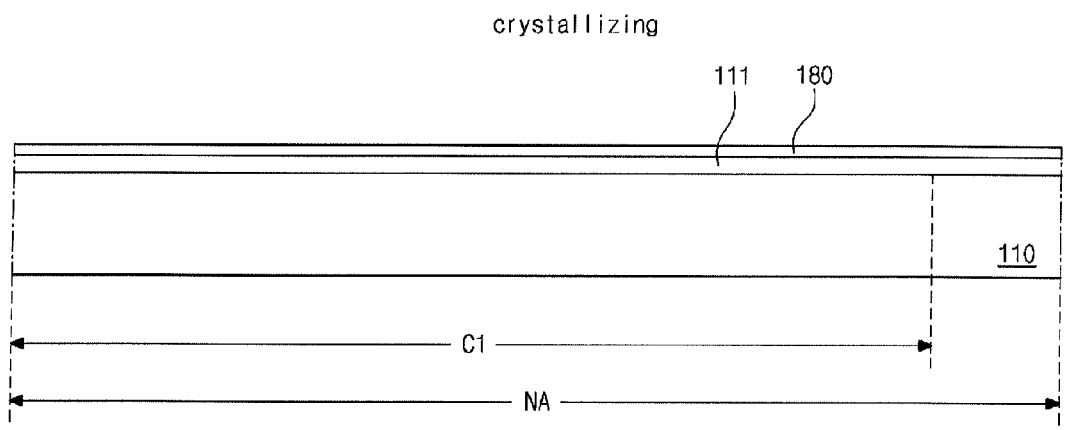
FIGS. 2A to 2M are cross-sectional views of illustrating a non-display area of the array substrate for an organic electroluminescent display device in steps of fabricating the same according to the first embodiment of the present invention.

In FIG. 1A and FIG. 2A, a buffer layer 111 is formed on a substrate 110 by depositing an inorganic insulating material such as silicon nitride (SiNx) or silicon oxide (SiO$_2$). When amorphous silicon is crystallized into polycrystalline silicon, alkali ions in the substrate 110 such as potassium ion (K$^+$) or sodium ion (Na$^+$), for example, may be diffused due to heats generated from laser irradiation or heat treatment. The buffer layer 111 prevents a semiconductor layer of polycrystalline silicon from being degraded by the alkali ions. The buffer layer 111 may be omitted depending on a material of the substrate 110.

Then, an amorphous silicon layer (not shown) is formed on a substantially entire surface of the substrate 110 by depositing amorphous silicon on the buffer layer 111.

Next, a polycrystalline silicon layer 180 is formed by crystallizing the amorphous silicon layer, and mobility properties of the polycrystalline silicon layer 180 are improved as compared with the amorphous silicon layer. Impurities are not doped in the amorphous silicon layer and the polycrystalline silicon layer 180. Beneficially, a solid phase crystallization (SPC) method or a laser crystallization method may be performed to crystallize the amorphous silicon layer.

More particularly, the solid phase crystallization method may be a thermal crystallization method of performing heat treatment under temperatures of 600 degrees of Celsius to 800 degrees of Celsius or an alternating magnetic field crystallization method under temperatures of 600 degrees of Celsius to 700 degrees of Celsius using alternating magnetic field apparatus. The laser crystallization method may be an excimer laser annealing method or a sequential lateral solidification method.

Figure 1B:
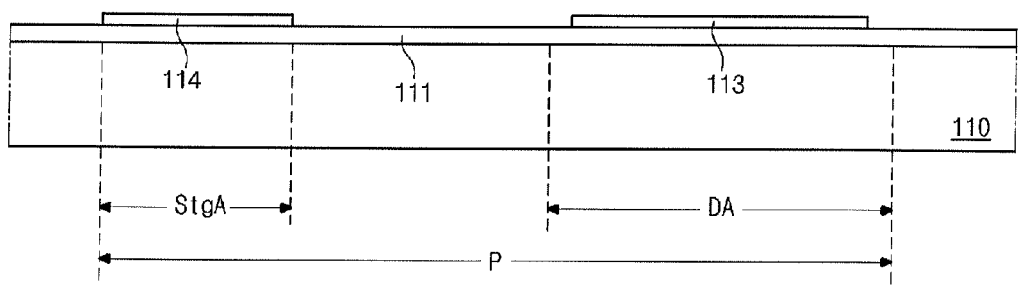
Figure 2B:
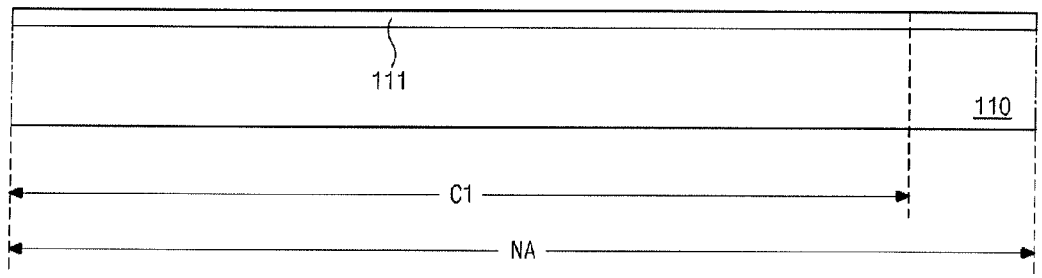

In FIG. 1B and FIG. 2B, a semiconductor layer 113 and a semiconductor pattern 114 are formed in the driving area DA and the storage area StgA, respectively, by patterning the polycrystalline silicon layer 180 of FIG. 1A through a mask process which includes applying photoresist, light-exposing using a photomask, developing the light-exposed photoresist, etching and stripping. The semiconductor pattern 114 will be doped with impurities later to have the improved conductive properties and function as a first storage electrode.

Figure 1C:
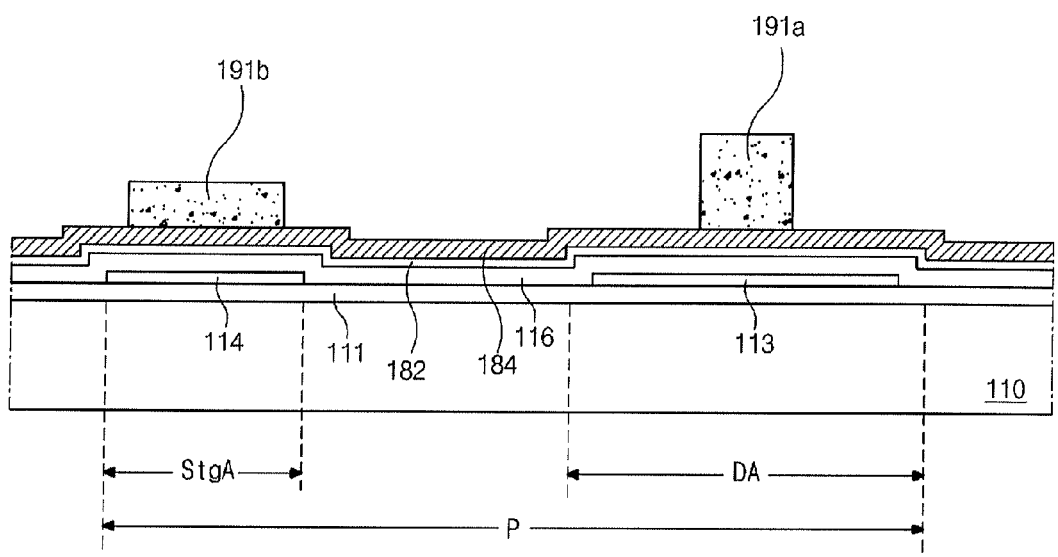
Figure 2C:
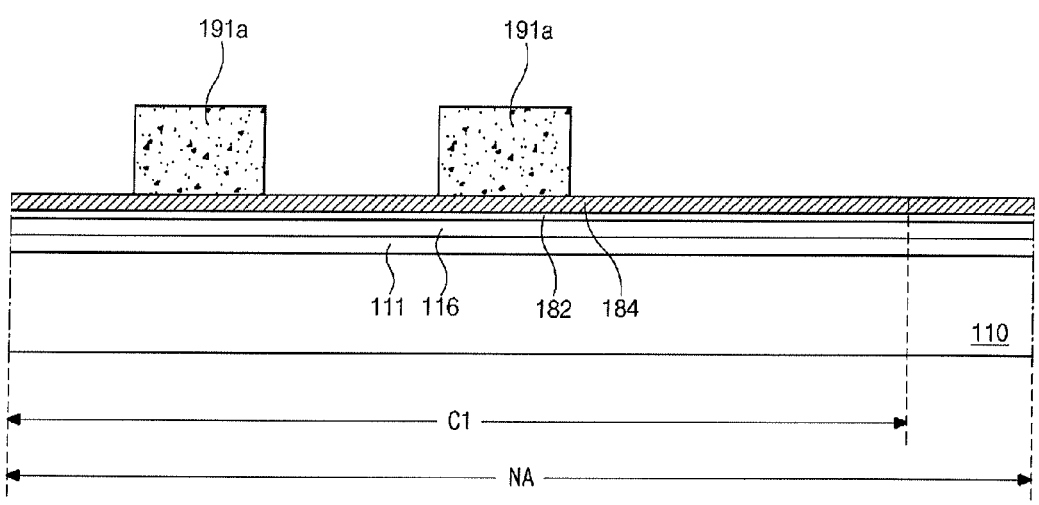

In FIG. 1C and FIG. 2C, a gate insulating layer 116 is formed on the semiconductor layer 113 and the semiconductor pattern 114 all over by depositing an inorganic insulating material such as silicon nitride (SiNx) or silicon oxide (SiO$_2$), for example.

A transparent conductive material layer 182 is formed on the gate insulating layer 117 all over by depositing a transparent conductive material such as indium tin oxide (ITO) or indium zinc oxide (IZO), for example, and then a gate metallic layer 184, as a first metallic layer, is formed on the transparent conductive material layer 182 by depositing one or more than two metallic materials having relatively low resistivity of aluminum (Al), aluminum alloy such as aluminum neodymium (AlNd), copper (Cu), copper alloy, molybdenum (Mo), or molybdenum titanium (MoTi) alloy, for example. The transparent conductive material layer 182 has a thickness of 100 Å to 500 Å. Even though the gate metallic layer 184 has a single-layered structure in the figures, the gate metallic layer 184 may have a multi-layered structure.

Next, a photoresist layer (not shown) is formed on the gate metallic layer 184 by applying photoresist. A photo mask (not shown) is disposed over the photoresist layer, and the photoresist layer is exposed to light through the photo mask. The photo mask includes a light-transmitting portion, a light-blocking portion, and a half light-transmitting portion.

The half light-transmitting portion may include slits or a multi-layered coating layer. When light passes through the half light-transmitting portion, light may be diffracted by the slits or may be partially transmitted by the multi-layered coating layer. Thus, the intensity of light passing through the half light-transmitting portion is less than the intensity of light passing through the light-transmitting portion.

A first photoresist pattern 191a and a second photoresist pattern 191b are formed on the gate metallic layer 184 by developing the photoresist layer exposed to light through the photo mask. The first photoresist pattern 191a corresponds to the light-transmitting portion of the photo mask and has a first thickness. The second photoresist pattern 191b corresponds to the half light-transmitting portion of the photo mask and has a second thickness, which is thinner than the first thickness. The photoresist layer corresponding to the light-blocking portion of the photo mask is removed to thereby expose the gate metallic layer 184.

Thus, the second photoresist pattern 191b having the second thickness is formed in the storage area StgA, which corresponds to the half light-transmitting portion of the photo mask. The first photoresist pattern 191a having the first thickness is formed to correspond to a central portion of the semiconductor layer 113 in the driving area DA and first auxiliary lines in a power source area C1 of the non-display area NA, which will be formed later. The first auxiliary lines include a common line. Although not shown in the figures, the first photoresist pattern 191a is also formed to correspond to a gate line and a gate link line.

Figure 1D:
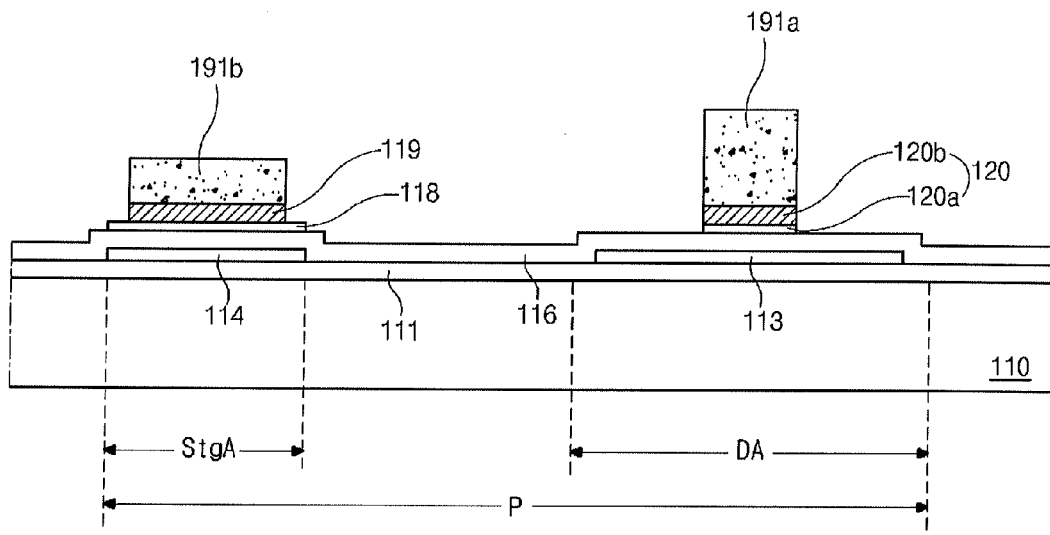
Figure 2D:
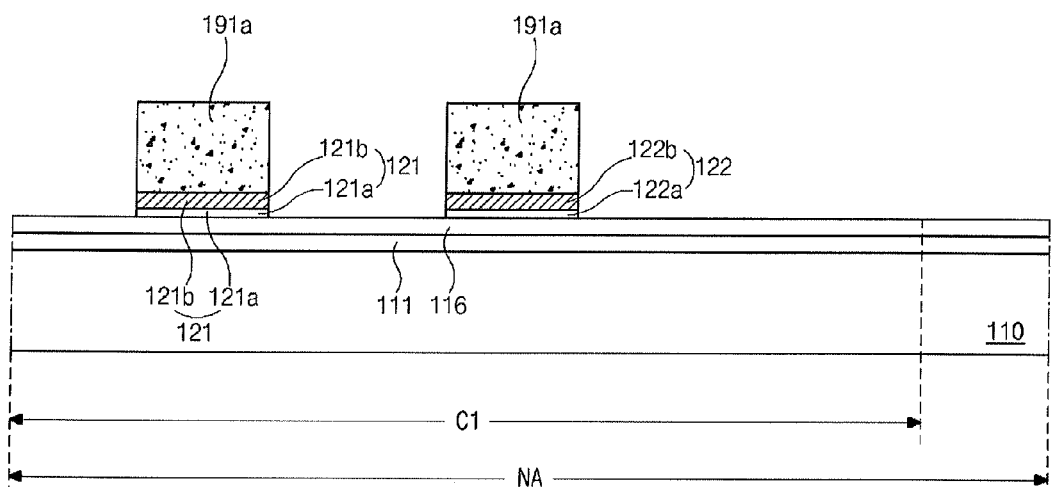

In FIG. 1D and FIG. 2D, a gate electrode 120, a second storage electrode 118, a dummy metallic pattern 119, and first auxiliary lines 121 and 122 are formed by sequentially etching and removing the gate metallic layer 184 of FIG. 1C and the transparent conductive material layer 182 of FIG. 1C. The gate electrode 120 includes a lower layer 120a of the transparent conductive material and au upper layer 120b of the metallic material having relatively low resistivity, wherein the lower layer 120a and the upper layer 120b are sequentially layered over the gate insulating layer 116 corresponding to the central portion of the semiconductor layer 113. The second storage electrode 118 is formed of the transparent conductive material, and the dummy metallic pattern 119 is formed of the metallic material. The second storage electrode 118 and the dummy metallic pattern 119 are sequentially disposed in the storage area StgA.

The first auxiliary lines 121 and 122 and the gate link line (not shown) are disposed in the non-display area NA, more particularly, in the power source area C1. The first auxiliary lines 121 and 122 include the common line. The first auxiliary lines 121 and 122 have lower layers 121a and 122a of the transparent conductive material and upper layer 121b and 122b of the metallic material having relatively low resistivity. In addition, the gate link line has a multi-layered structure including a lower layer of the transparent conductive material and an upper layer of the metallic material having relatively low resistivity.

In the meantime, although not shown in the figures, a gate line having a multi-layered structure is formed on the gate insulating layer 116 in a display area and extends along a direction corresponding to a boundary of the pixel region P. The gate line is connected to a gate electrode of a switching thin film transistor (not shown).

Figure 1E:
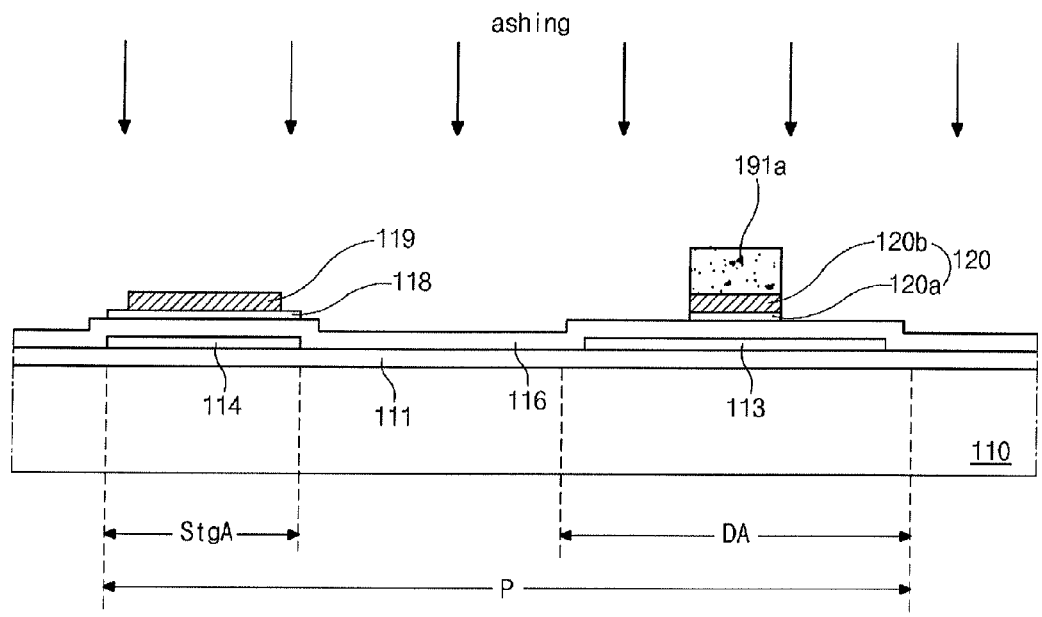
Figure 2E:
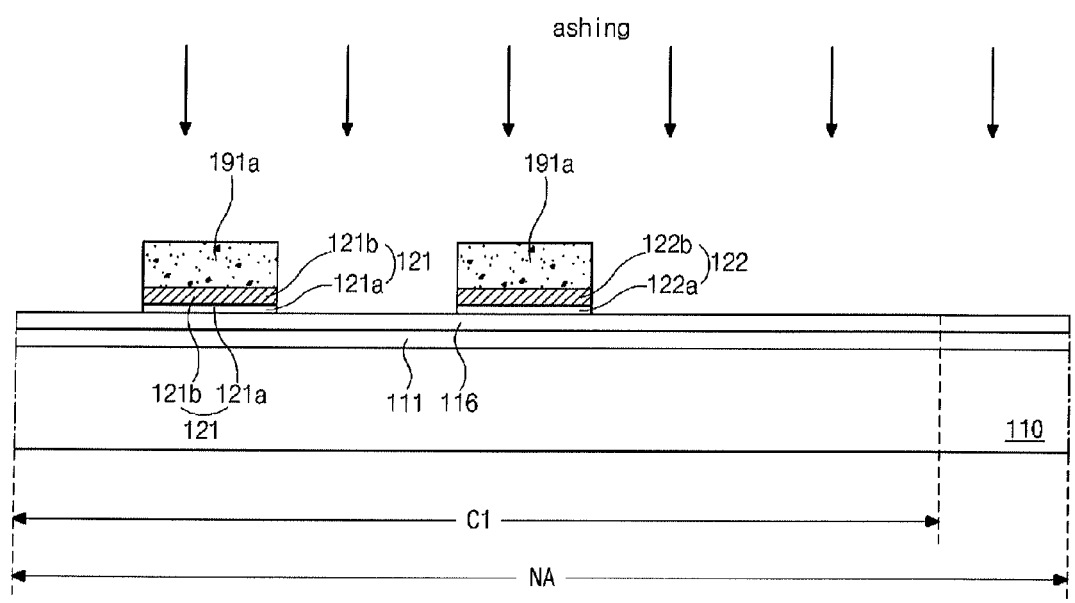

In FIG. 1E and FIG. 2E, an ashing process is performed to remove the second photoresist 191b of FIG. 1D having the second thickness and to expose the dummy metallic pattern 119 in the storage area StgA.

At this time, the first photoresist pattern 191a also has a reduced thickness due to the ashing process and remains on the gate electrode 120, the gate line, the gate link line, and the first auxiliary lines 121 and 122.

Figure 1F:
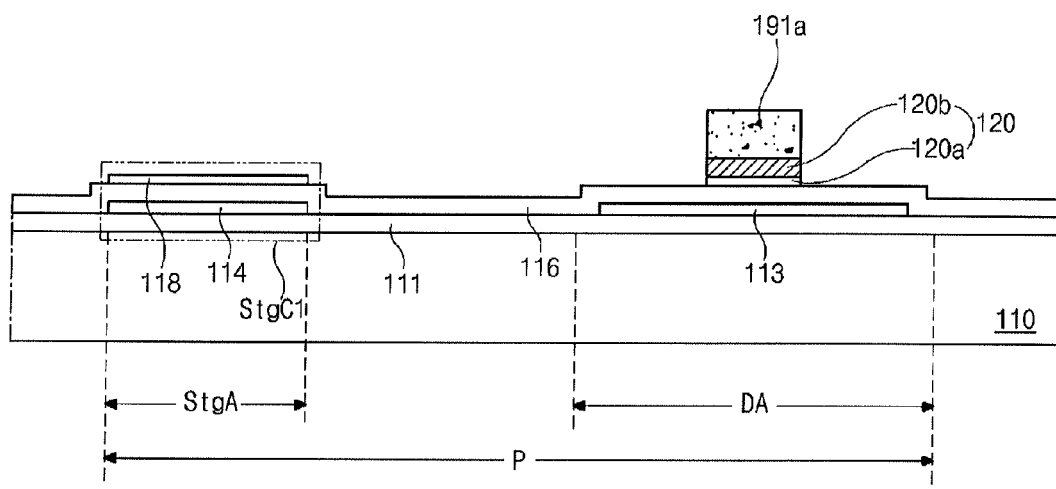
Figure 2F:
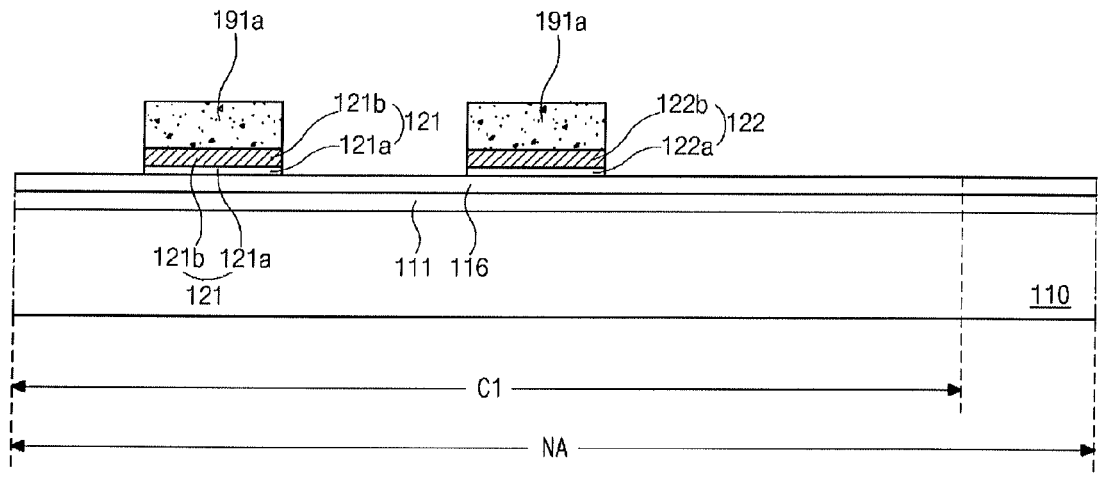

In FIG. 1F and FIG. 2F, the dummy metallic pattern 119 of FIG. 1E exposed by removing the second photoresist pattern 191b of FIG. 1D is removed to thereby expose the second storage electrode 118 of the transparent conductive material in the storage area StgA.

Figure 1G:
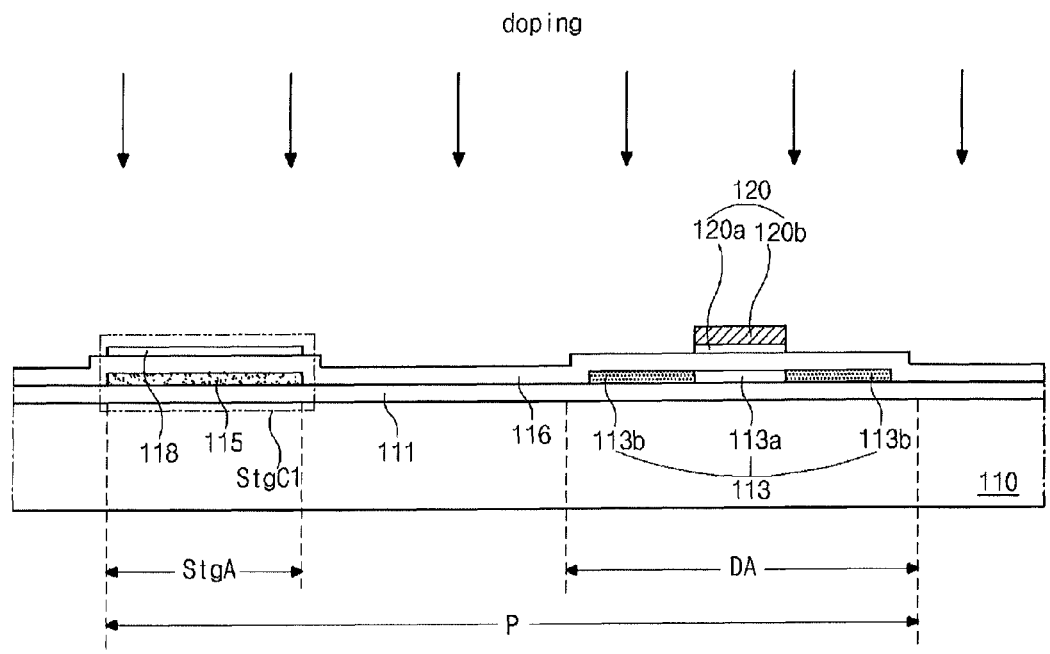
Figure 2G:
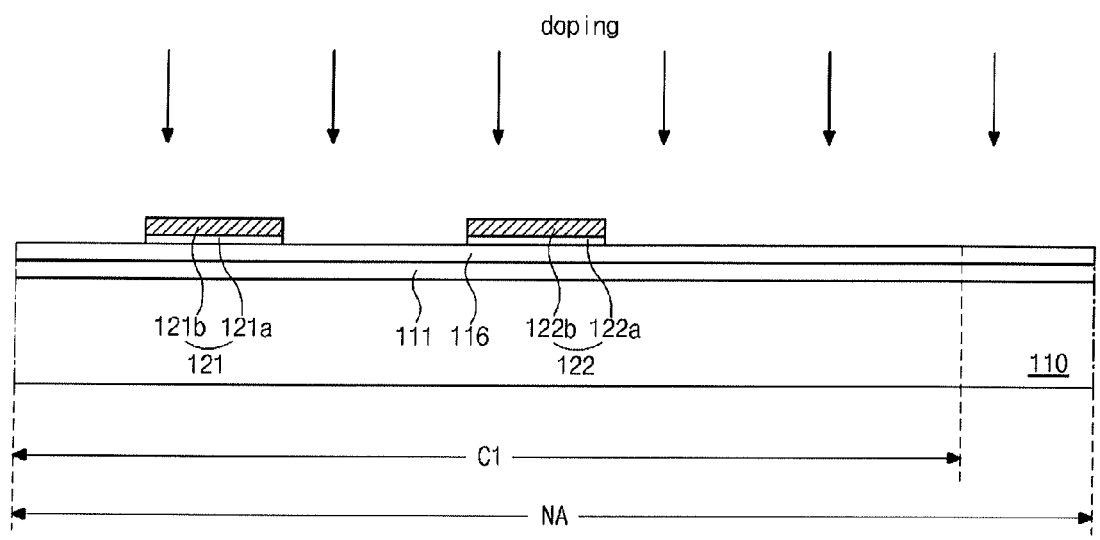

In FIG. 1G and FIG. 2G, a stripping process is carried out to thereby remove the first photoresist pattern 191a of FIG. 1F and FIG. 2F and expose the gate electrode 120, the gate line (not shown), the gate link line (not shown) and the first auxiliary lines 121 and 122.

Then, impurities are doped using the gate electrode 120, more precisely, the upper layer 120b of the gate electrode 120, as a doping blocking mask. The impurities may be p-type such as boron (B), indium (In) or gallium (Ga), for example, or n-type such as phosphorous (P), arsenic (As) or antimony (Sb), for example.

Therefore, a first dose of impurities are doped into the semiconductor pattern 114 of FIG. 1F in the storage area StgA, and the semiconductor pattern 114 of FIG. 1F doped with the impurities has an increased conductivity to become a first storage electrode 115.

Here, even though the second storage electrode 118 of the transparent conductive material is formed in the storage area StgA, the second storage electrode 118 has a thickness of 100 Å to 500 Å, and thus the impurities can reach the inside of the semiconductor pattern 114 of FIG. 1F through the second storage electrode 118 by controlling the energy density of the impurities during a doping process.

Additionally, in the driving area DA, the impurities are doped into the semiconductor layer 113 uncovered by the upper layer 120b of the gate electrode 120, and ohmic contact layers 113b are formed. The central portion of the semiconductor layer 113 is not doped with the impurities due to the upper layer 120b of the gate electrode 120 and still includes intrinsic polycrystalline silicon.

Accordingly, after the doping process, the semiconductor layer 113 in the driving area DA includes an active layer 113a of intrinsic polycrystalline silicon and the ohmic contact layers 113b of impurity-doped polycrystalline silicon at both sides of the active layer 113a.

Meanwhile, in the storage area StgA, the first storage electrode 115 doped with the impurities, the gate insulating layer 116 and the second storage electrode 118 constitute a first storage capacitor StgC1.

Figure 1H:
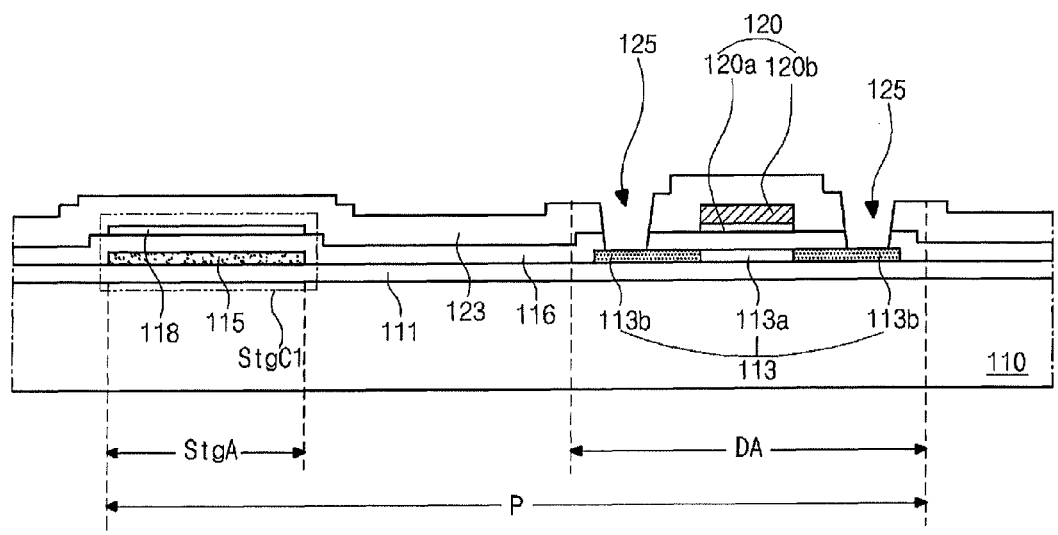
Figure 2H:
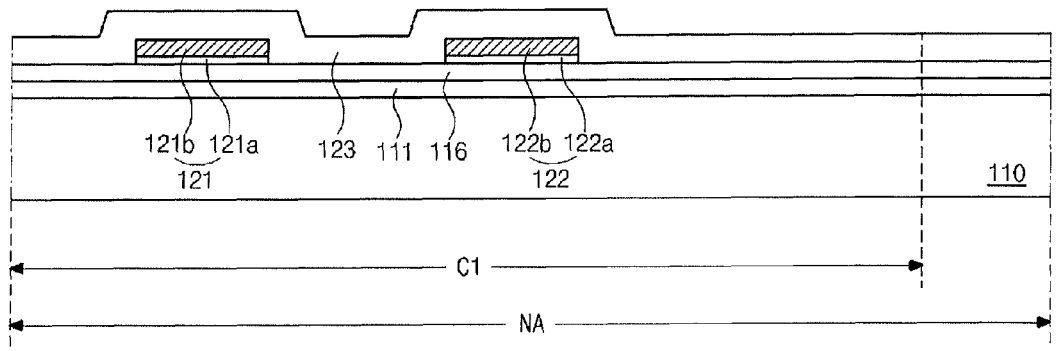

In FIG. 1H and FIG. 2H, an inter insulating layer 123 is formed on the gate electrode 120, the gate line (not shown), the second storage electrode 118, the gate link line (not shown) and the first auxiliary lines 121 and 122 by depositing an inorganic insulating material such as silicon oxide ($SiO_2$) or silicon nitride (SiNx).

Then, the inter insulating layer 123 is patterned with the gate insulating layer 116 through a mask process to form semiconductor contact holes 125 exposing the ohmic contact layers 113b of the semiconductor layer 113.

Figure 1I:
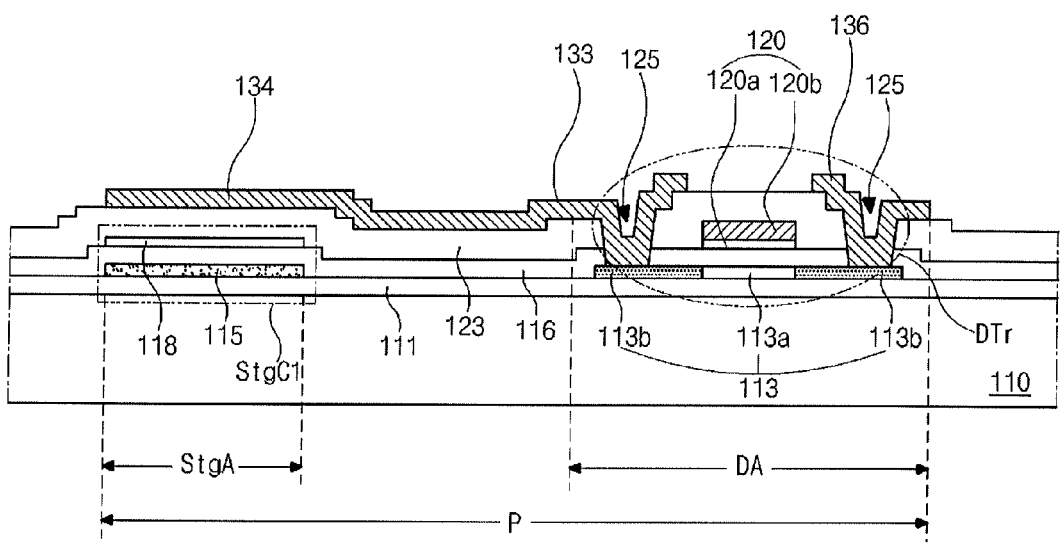
Figure 2I:
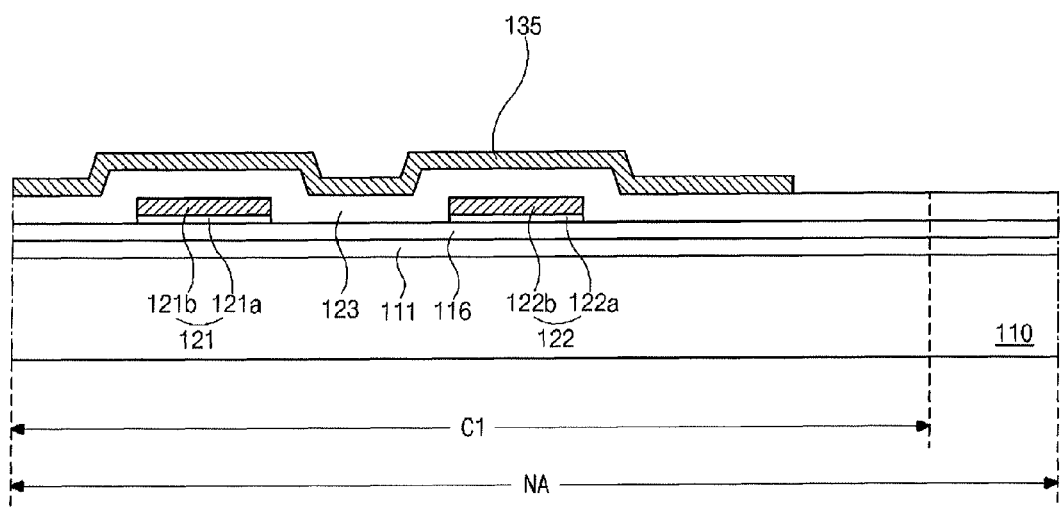

Next, in FIG. 1I and FIG. 2I, a second metallic layer (not shown) is formed on the inter insulating layer 123 having the semiconductor contact holes 125 by depositing one or more than two metallic materials of aluminum (Al), aluminum alloy such as aluminum neodymium (AlNd), copper (Cu), copper alloy, titanium (Ti), molybdenum (Mo), or molybdenum titanium (MoTi) alloy. For instance, the second metallic layer may have a triple-layered structure of titanium layer/ aluminum layer/titanium layer.

The second metallic layer is patterned through a mask process to thereby form a data line (not shown) and a power source line (not shown). The data line extends along another boundary of the pixel region P and crosses the gate line to define the pixel region. The power source line is spaced apart from and parallel to the data line. At this time, a second auxiliary line 135, a power source link line (not shown) and a data link line (not shown) are formed in the power source area C1 of the non-display area NA. The power source link line is connected to the power source line, and the data link line is connected to the data line. The second auxiliary line 135 may be a Vcc signal line, a Vdd signal line, a Vgh signal line, a Vgl signal line or a Vref signal line, for example.

Simultaneously, source and drain electrodes 133 and 136 are formed in the driving area DA. The source and drain electrodes 133 and 136 are spaced apart from each other and contact the ohmic contact layers 113b through the semiconductor contact holes 125. A third storage electrode 134 is formed on the inter insulating layer 123 over the second storage electrode 118 in the storage area StgA and is connected to the source electrode 133. In the storage area StgA, the second storage electrode 118, the inter insulating layer 123 and the third storage electrode 134 constitute a second storage capacitor StgC2. The first and second storage capacitors StgC1 and StgC2 are connected to each other in parallel through the second storage electrode 118, and thus a total capacitance of the storage capacitors increases.

Figure 1J:
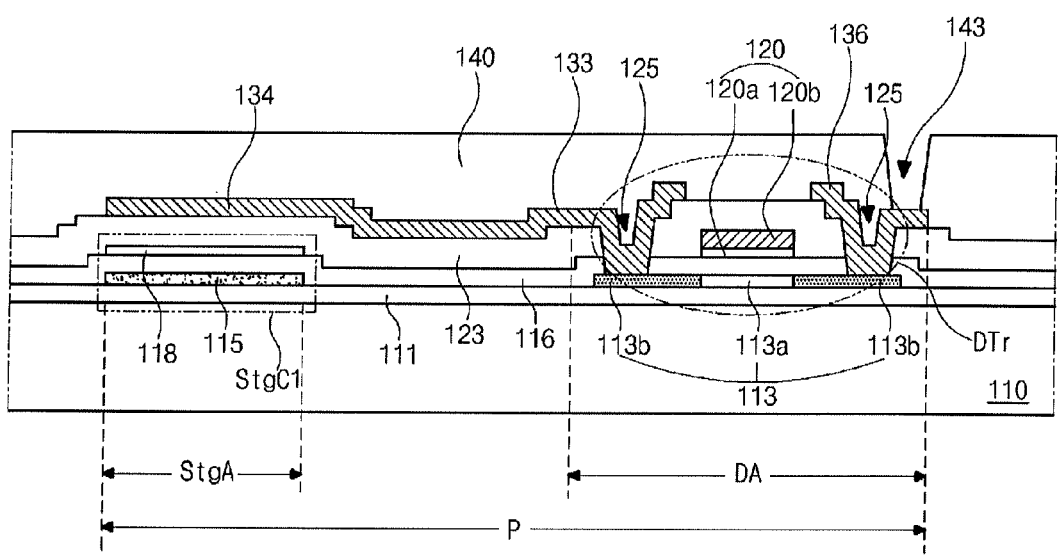
Figure 2J:
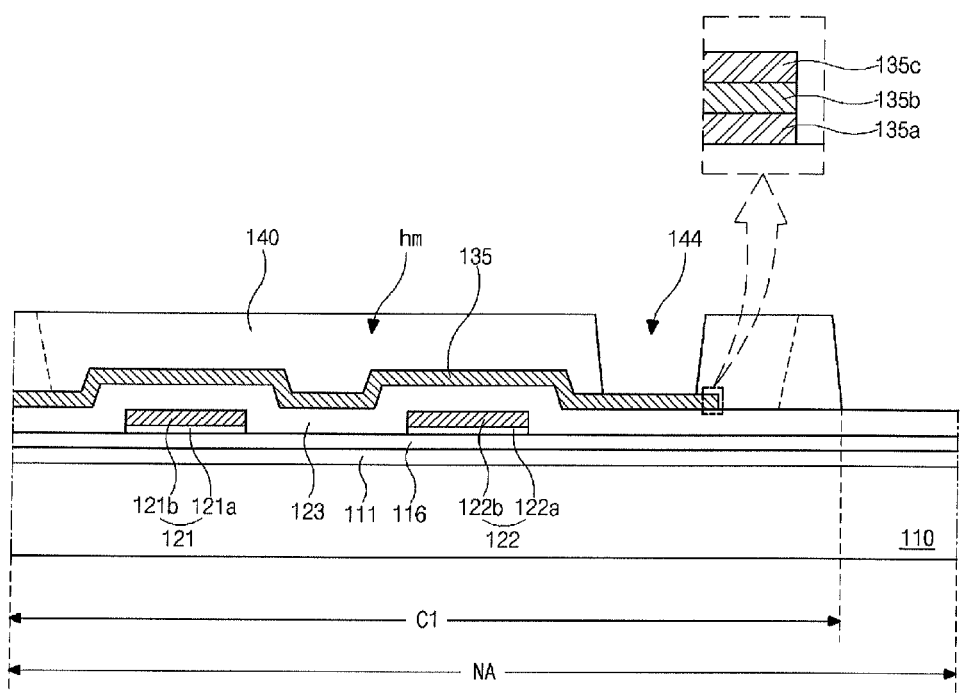

In FIG. 1J and FIG. 2J, an organic insulating material layer (not shown) is formed on the source and drain electrodes 133 and 136, the data line (not shown), the data link line (not shown), the power source line (not shown), the power source link line (not shown), the third storage electrode 134 and the second auxiliary line 135 by applying an organic insulating material having a photosensitive property, for example, photo acryl or benzocyclobutene (BCB).

Then, the organic insulating material layer is patterned through a mask process to thereby form a passivation layer 140 in the display area and the non-display area NA. The passivation layer 140 has a drain contact hole 143 and an auxiliary line contact hole 144. The drain contact hole 143 exposes the drain electrode 136 in the driving area DA. The auxiliary line contact hole 144 exposes the second auxiliary line 135 in the power source area C1 of the non-display area NA. The passivation layer 140 also exposes the inter insulating layer 123 in the non-display area NA excluding the power source area C1.

Here, a groove hm is formed in the passivation layer 140 of the power source area C1 of the non-display area NA to surround the display area as indicated by a dashed line. The groove hm corresponds to a seal pattern (not shown) or a frit pattern (not shown), which will be formed later. The groove hm substantially exposes the inter insulating layer 123 and another second auxiliary line. That is, the groove hm may be formed over another second auxiliary line, which is different from the second auxiliary line 135 exposed by the auxiliary line contact hole 144 in FIG. 2J.

Meanwhile, the passivation layer 140 covers ends and/or sides of the second auxiliary line 135, which is exposed by the auxiliary line contact hole 144 and will contact a line connection pattern 149 of FIG. 2K that will be formed of the same material as a first electrode 147 of FIG. 1M later.

Figure 2K:
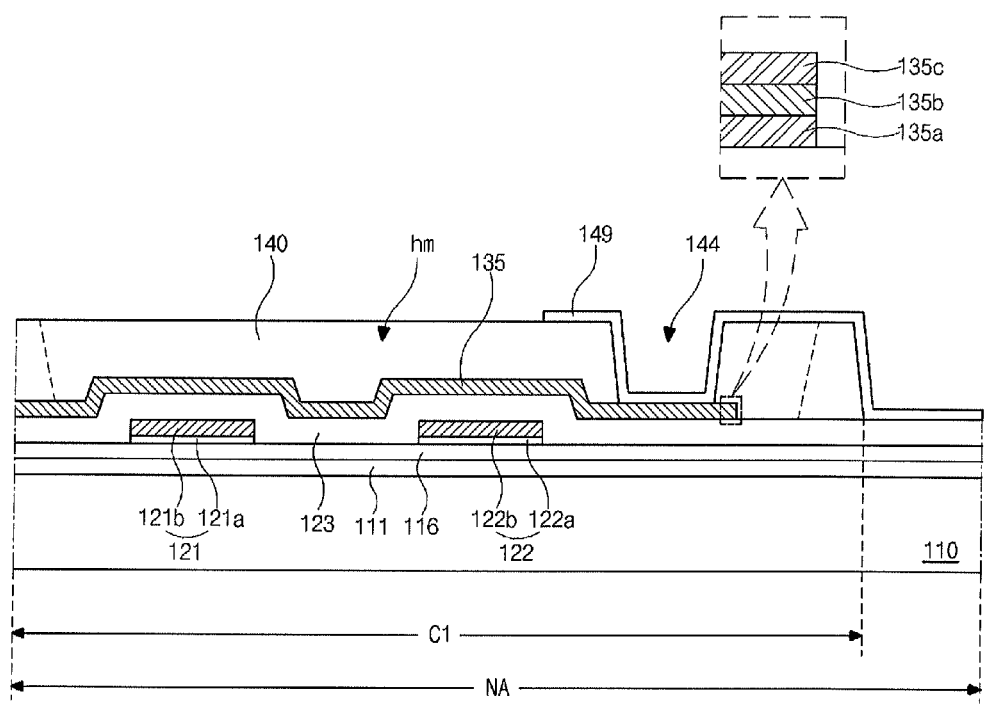

Forming the passivation layer 140 of the organic insulating material having the groove hm corresponding to the non-display area NA and covering the ends and/or sides of the second auxiliary line 135 that will contact the line connection pattern 149 of FIG. 2K corresponding to the power source area C1 of the non-display area NA is to improve an adhesion property of the seal pattern or the frit pattern and to prevent disconnection of the line connection pattern 149 of FIG. 2K around the ends and/or sides of the second auxiliary line 135 by minimizing damages of the ends and/or sides of the second auxiliary line 135.

Namely, when the array substrate is attached with a counter substrate (not shown) for encapsulation, the adhesion property between the array substrate and the counter substrate due to the seal pattern or the frit pattern can be improved by forming the groove hm in the passivation layer 140 corresponding to the non-display area NA and forming the seal pattern or the frit pattern along the groove hm.

If the adhesion of the seal pattern or the frit pattern is lowered, when the array substrate and the counter substrate are attached to form a display panel, the display panel may not be maintained and may become unfastened. Thus, moisture and oxygen from the outside may permeate into the display panel, and the life span of the organic electroluminescent display device may be shortened.

The seal pattern or the frit pattern has better adhesion properties with an inorganic material than with an organic material. Therefore, the above-mentioned problem due to the lowered adhesion property can be solved by selectively removing the passivation layer 140 of an organic material to form the groove hm exposing the inter insulating layer 123 and forming the seal pattern or the frit pattern contacting the inter insulating layer 123 exposed by the groove hm.

At this time, the passivation layer 140 is not entirely removed and does not have the groove hm over the second auxiliary line 135, which will contact another second auxiliary line adjacent thereto or a driving element of a driving unit (not shown) through the line connection pattern 149 of FIG. 2K later, and the passivation layer 140 completely covers the ends and/or sides of the second auxiliary line 135. Instead, the passivation layer 140 has the auxiliary line contact hole 144 exposing the second auxiliary line 135 to contact the second auxiliary line 135 with the line connection pattern 149 of FIG. 2K.

Figure 1K:
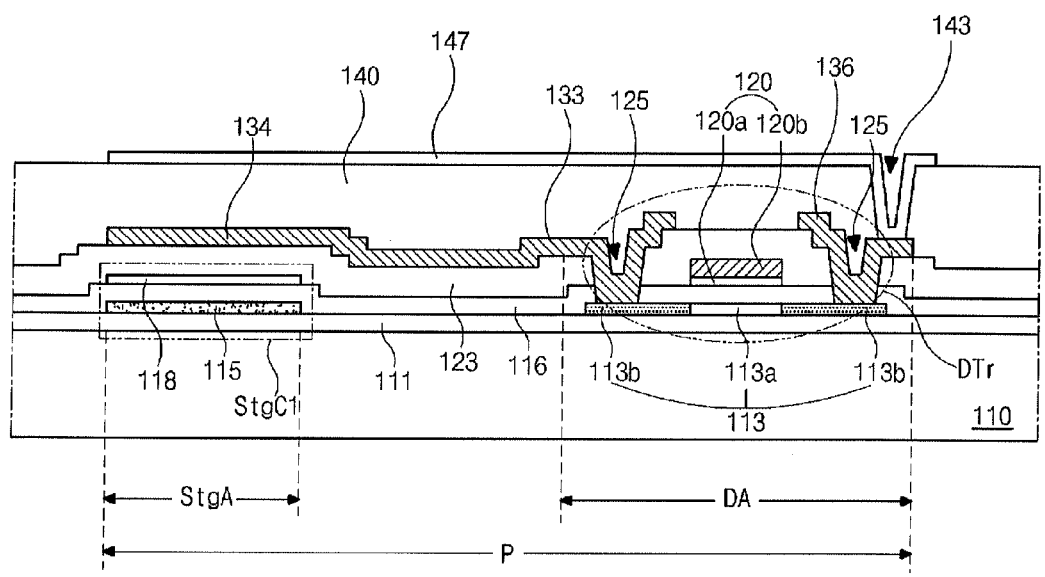
Figure 1L:
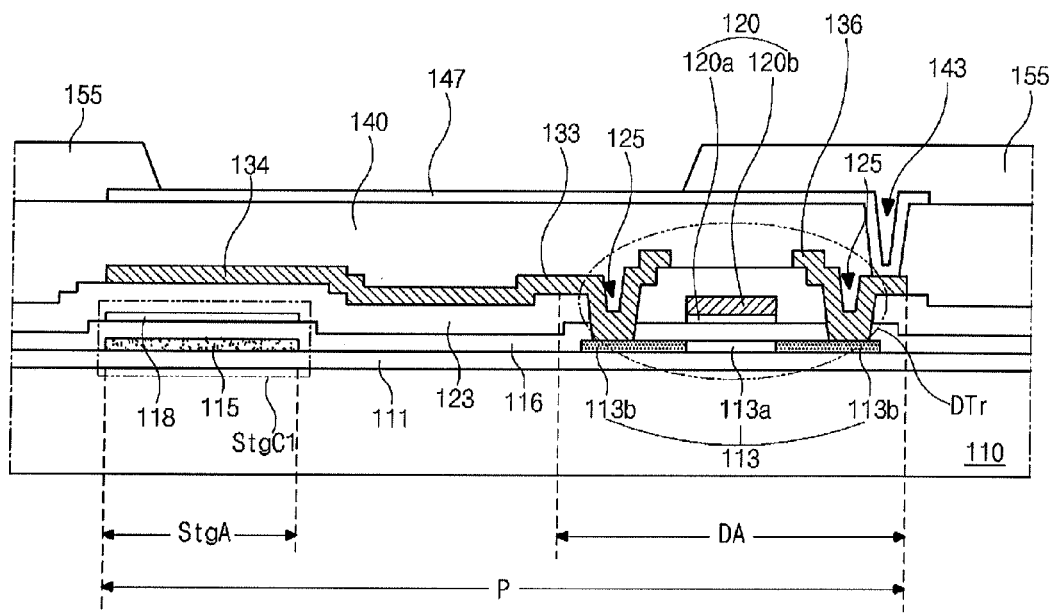
Figure 1M:
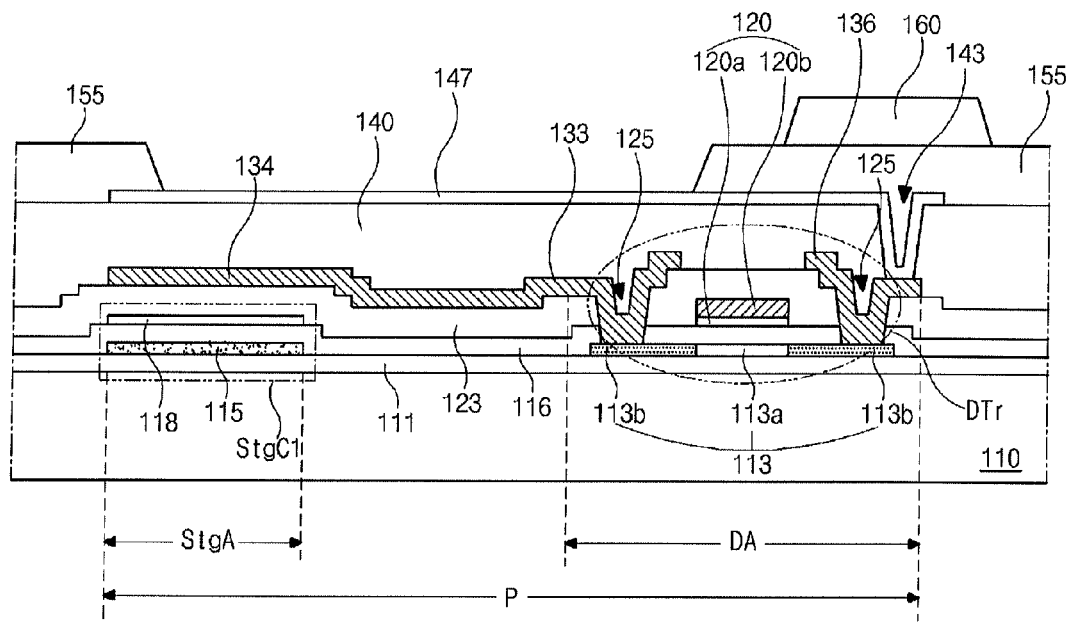

If the passivation layer 140 has the groove hm over the second auxiliary line 135 corresponding to the power source area C1 of the non-display area NA to thereby expose the second auxiliary line 135, the second auxiliary line 135 is continually exposed to developer and/or etchant for patterning the first electrode of FIG. 1M, a bank 155 of FIG. 1M and a spacer 160 of FIG. 1M, for example.

In this case, the second auxiliary line 135 exposed by the groove hm is exposed to the developer and/or etchant and is partially etched, so that the ends and/or sides of the second auxiliary line 135 are damaged.

Figure 3:
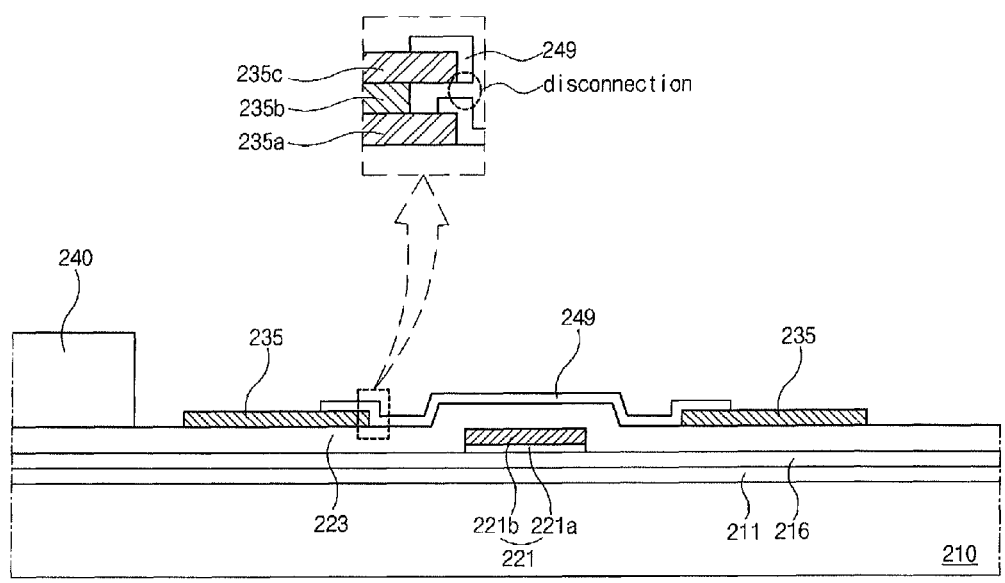
FIG. 3 is a cross-sectional view of illustrating a non-display area of an array substrate for an organic electroluminescent display device according to a comparative example.

FIG. 3 is a cross-sectional view of illustrating a non-display area of an array substrate for an organic electroluminescent display device according to a comparative example. Similar references will be used for the same or similar parts as the first embodiment. Here, the passivation layer 140 may not be formed in the power source area of the non-display area or the groove may be formed to correspond to the entire power source area.

In FIG. 3, the second auxiliary line 235 may have a triple-layered structure of a titanium layer 235a, an aluminum layer 235b and a titanium layer 235c, for example. Since the ends and/or sides of the second auxiliary line 235 are not shielded by the passivation layer 240, the ends and/or sides of the second auxiliary line 235 are exposed to the developer or etchant for forming other elements. At this time, the aluminum layer 235b is etched faster than the titanium layers 235a and 235c at the ends and/or sides of the second auxiliary line 235 due to etch selectivity between metallic materials, thereby forming an undercut structure in which an end side of the aluminum layer 235b is disposed further inside than end sides of the titanium layers 235a and 235c by 0.2 micrometers to 1 micrometer.

If the second auxiliary line 235 has the undercut structure at the ends and/or sides thereof, when the line connection pattern 249 of a conductive material is formed along the ends and/or sides of the second auxiliary line 235, there may be disconnection of the line connection pattern 249 due to the undercut structure at the ends and/or sides of the second auxiliary line 235. The line connection pattern 249 may not be electrically connected, and a driving problem may be caused.

Accordingly, referring to FIG. 1J and FIG. 2J, in the first embodiment of the present invention, while the passivation layer 140 of the organic material has the groove hm in the power source area C1 of the non-display area NA surrounding the display area for improving the adhesion property of the seal pattern or the frit pattern, the passivation layer 140 covers the ends and/or sides of the second auxiliary line 135, which will overlap and contact the line connection pattern 149 of FIG. 2K later.

In FIG. 1K and FIG. 2K, the first electrode 147 of the organic light-emitting diode is formed on the passivation layer 140 having the drain contact hole 143, the groove hm and the auxiliary line contact hole 144 by depositing a transparent conductive material having relatively high work function such as indium tin oxide or indium zinc oxide and then patterning in through a mask process. The first electrode 147 contacts the drain electrode 136 through the drain contact hole 143.

At the same time, the line connection pattern 149 is formed on the passivation layer 140 in the power source area C1 of the non-display area NA. The line connection pattern 149 contacts the second auxiliary line 135 through the auxiliary line contact hole 144.

The line connection pattern 149 contacts two second auxiliary lines 135 adjacent to each other or the second auxiliary line 135 and the driving element of the driving unit (not shown), and thus the line connection pattern 149 electrically connects the two second auxiliary lines 135 or the second auxiliary line 135 and the driving element of the driving unit. Additionally, in the first embodiment of the present invention, only an upper surface of the second auxiliary line 135 is partially exposed by the auxiliary line contact hole 144, and the ends and/or sides of the second auxiliary line 135 are not exposed. Thus, the line connection pattern 249 of FIG. 3 is prevented from being disconnected around the ends and/or sides of the second auxiliary line 235 of FIG. 3 due to the undercut structure of the second auxiliary line 235 of FIG. 3.

In the meantime, to improve the luminous efficiency, the first electrode 147 may have a double-layered structure including a lower layer of a metallic material having relatively high reflectance and an upper layer of a conductive material having relatively high work function by depositing the metallic material having relatively high reflectance and the conductive material having relatively high work function and then patterning them. The metallic material having relatively high reflectance may include aluminum (Al), aluminum alloy such as aluminum neodymium (AlNd), or silver (Ag). The conductive material having relatively high work function may include the transparent conductive material such as indium tin oxide or indium zinc oxide. When the first electrode 147 has the double-layered structure mentioned above, the organic electroluminescent display device may be a top-emission type.

Figure 2L:
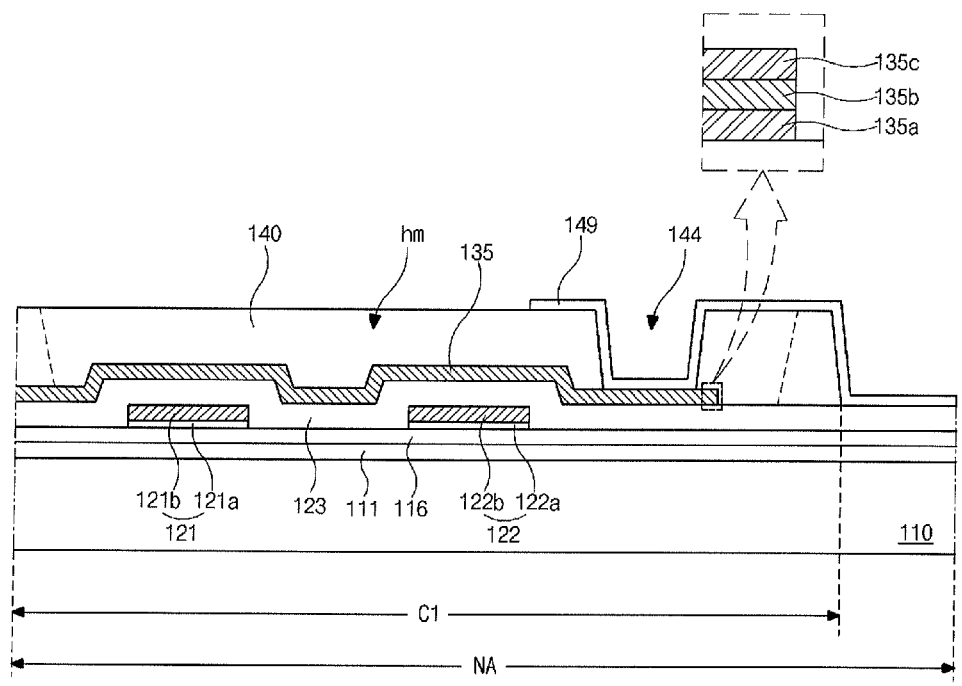

Next, in FIG. 1L and FIG. 2L, a first organic insulating layer (not shown) is formed on the first electrode 147 by applying or depositing an organic insulating material such as photo acryl, benzocyclobutene or polyimide and is patterned to thereby form a bank 155 corresponding to the gate line (not shown) and the data line (not shown).

Here, the bank 155 overlaps edges of the first electrode 147 in each pixel region P. Thus, the bank 155 edges each pixel region P in the display area and has a lattice shape in a plan view. The bank 155 is removed in the non-display area NA.

Figure 2M:
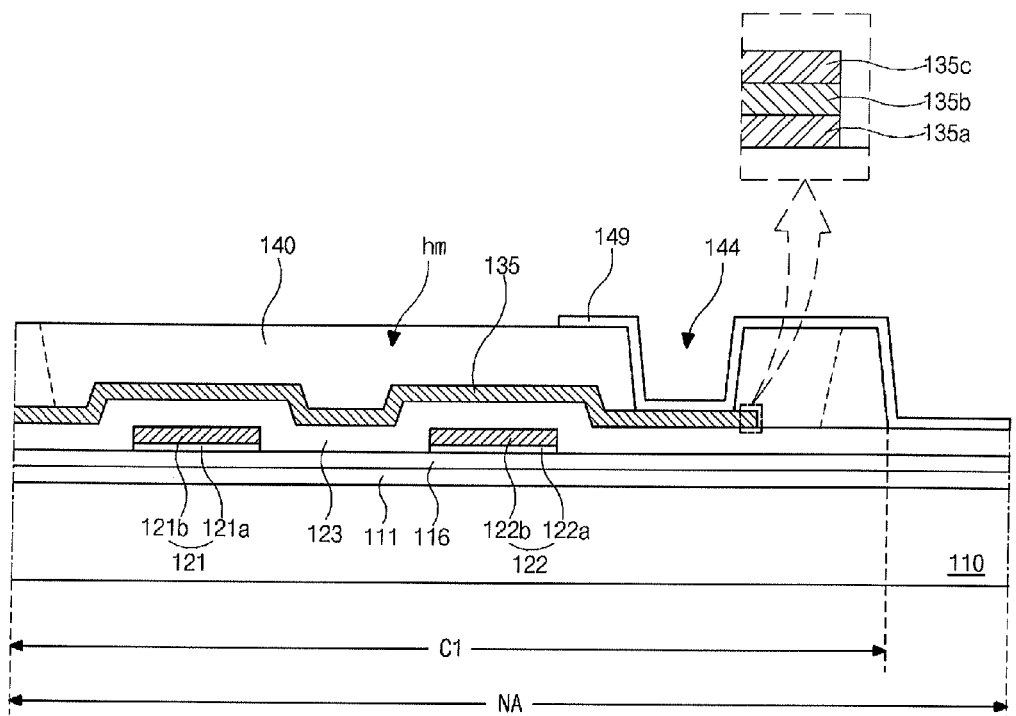

In FIG. 1M and FIG. 2M, a second organic insulating layer (not shown) is formed on the bank 155 by applying or depositing an organic insulating material different from the bank 155 and then is patterned to thereby form a spacer 160 on the bank 155. FIG. 2L and FIG. 2M are substantially the same as FIG. 2K.

Accordingly, the array substrate for the organic electroluminescent display device according to the first embodiment of the present invention is completed.

The array substrate according to the first embodiment of the present invention is manufactured through 8 mask processes, which are reduced by 2 mask processes as compared with 10 mask processes of the related art.

Figure 4A:
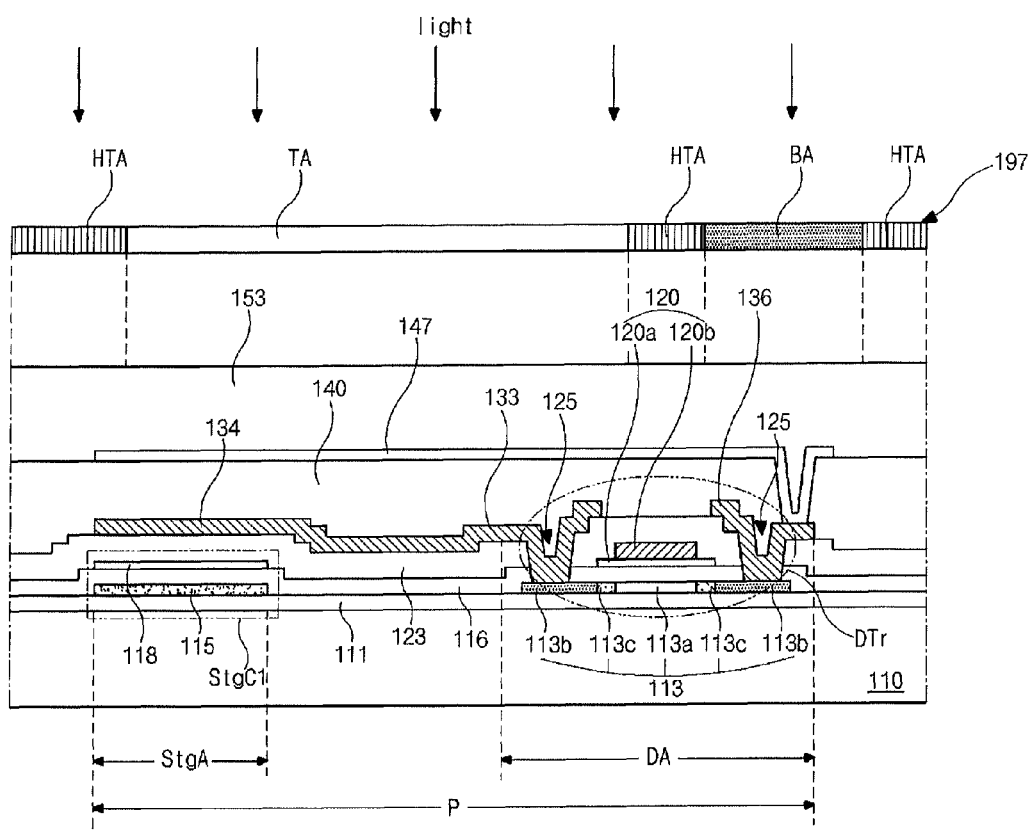
FIG. 4A and FIG. 4B are cross-sectional views of illustrating a pixel region of an array substrate for an organic electroluminescent display device in steps of fabricating the same according to a second embodiment of the present invention.
Figure 4B:
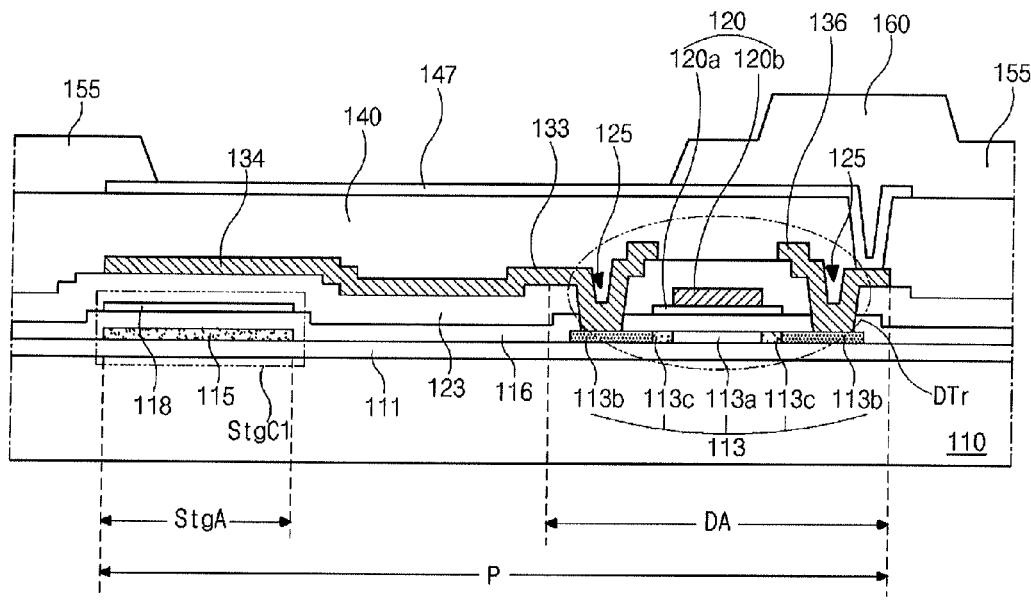
Figure 5:
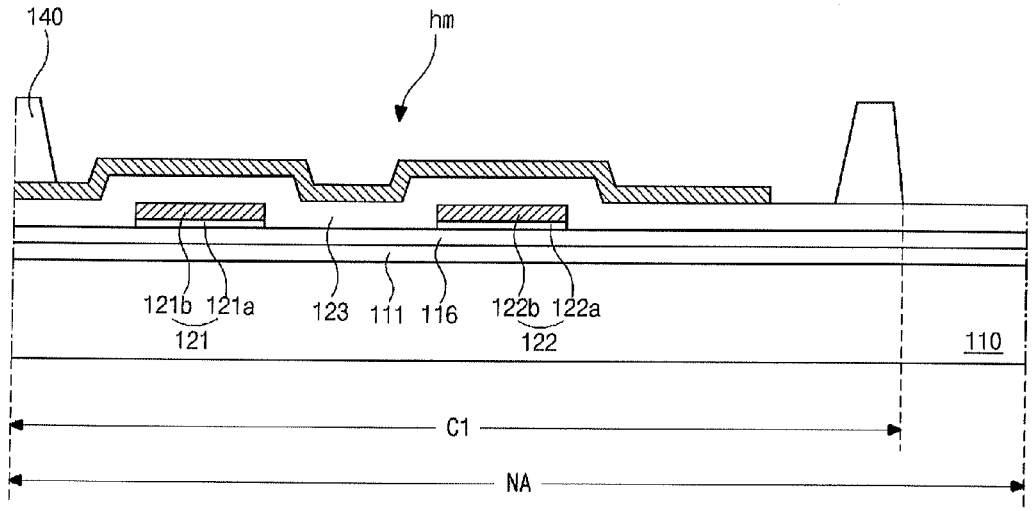
FIG. 5 is a cross-sectional view of illustrating a groove in a non-display area of the array substrate for an organic electroluminescent display device according to an exemplary embodiment of the present invention.

FIG. 4A and FIG. 4B are cross-sectional views of illustrating a pixel region of an array substrate for an organic electroluminescent display device in steps of fabricating the same according to a second embodiment of the present invention. The second embodiment has the same structure as the first embodiment in the non-display area, and drawings for the non-display area are omitted.

The second embodiment has the same steps as the first embodiment except for steps of forming a bank and a spacer. Explanation of the same steps will be omitted, and the steps of forming the bank and the space will be described.

In FIG. 4A, an organic insulating layer 153 is formed on the first electrode 147 by applying or depositing an organic insulating material having a photosensitive property such as photo acryl, benzocyclobutene or polyimide.

A photo mask 197 is disposed over the organic insulating layer 153. The photo mask 197 includes a light-blocking portion BA, a light-transmitting portion TA and a half light-transmitting portion HTA. Then, diffraction exposure or half-tone exposure is performed by irradiating light to the organic insulating layer 153 through the photo mask 197.

In FIG. 4B, the organic insulating layer 153 of FIG. 4A exposed to the light is developed, thereby forming a bank 155 along boundaries of the pixel region P and a spacer 160 over the bank 155 along one of the boundaries of the pixel region P. The spacer 160 has a first height and corresponds to the light-blocking portion BA of FIG. 4A of the photo mask 197 of FIG. 4A. The bank 155 has a second height lower than the first height and corresponds to the half light-transmitting portion HTA of FIG. 4A of the photo mask 197 of FIG. 4A. The bank 155 overlaps the edges of the first electrode 147.

The organic insulating layer 153 of FIG. 4A corresponding to the light-transmitting portion TA of FIG. 4A of the photo mask 197 of FIG. 4A is removed during a developing process to thereby expose the first electrode 147 in the pixel region P. Here, the organic insulating layer 153 of FIG. 4A is a positive type, a portion of which exposed to light is removed after the developing process. However, the organic insulating layer 153 of FIG. 4A may be a negative type, a portion which exposed to light remains after the developing process.

Accordingly, the array substrate for an organic electroluminescent display device according to the second embodiment of the present invention is completed.

In the second embodiment of the present invention, since the bank 155 and the spacer 160 are formed through one mask process, the array substrate may be manufactured through 7 mask processes. Therefore, in the second embodiment of the present invention, manufacturing time and costs are further reduced as compared with the related art in which the array substrate is manufactured through 10 mask processes.

Meanwhile, a shadow mask having an opening corresponding to the pixel region P is disposed over the array substrate according to the first or second embodiment of the present invention such that the shadow mask contacts the spacer 160, and thermal deposition is performed under vacuum, thereby forming an organic luminous layer (not shown) on the first electrode 147 in the pixel region P surrounded by the bank 155.

Subsequently, a second electrode (not shown) is formed on the organic luminous layer by depositing a metallic material having relatively low work function, for example, aluminum (Al), aluminum neodymium (AlNd) alloy, aluminum magnesium (AlMg) alloy, magnesium silver (MgAg) alloy or silver (Ag), all over the display area. The first electrode 147, the organic luminous layer and the second electrode constitute the organic light-emitting diode.

Then, the counter substrate (not show) may be disposed over the array substrate. The seal pattern (not shown) or the frit pattern (not shown) may be formed along the groove hm such that the seal pattern or the frit pattern fills up the groove hm and contacts the passivation layer 140 under vacuum or inert gas atmosphere. Therefore, the array substrate and the counter substrate may be attached to each other.

The seal pattern or the frit pattern may have a height higher than that of the passivation layer 140. Even though the seal pattern or the frit pattern fills up the groove hm and overlaps and contacts the passivation layer 150 at both sides of the groove hm, most of the seal pattern or the frit pattern is formed to correspond to the groove hm that is formed by removing the passivation layer 140. Thus, the adhesion properties are prevented from being lowered due to the contact with passivation layer 140.

In the present invention, the array substrate including the polycrystalline silicon thin film transistor is manufactured through seven or eight mask processes, and the manufacturing processes are reduced in comparison with the related art. Therefore, the manufacturing time and costs are decreased.

Moreover, although the passivation layer of inorganic insulating material is omitted and only one passivation layer of organic insulating material is formed, the auxiliary lines of the same material on the same layer as the source and drain electrodes are not damaged, and the disconnection of the line connection pattern of the same material on the same layer as the first electrode is prevented. Accordingly, the disconnection between signal lines or connection patterns can be prevented.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. An array substrate for an organic electroluminescent display device, comprising:
    a substrate including a display area and a non-display area, wherein the display area includes a pixel region and the non-display area includes a power source area;
    a gate line and a data line with an inter insulating layer therebetween and crossing each other to define the pixel region;
    a thin film transistor in a driving area of the pixel region and including a semiconductor layer of polycrystalline silicon, a gate insulating layer, a gate electrode, the inter insulating layer, a source electrode, and a drain electrode;
    auxiliary lines of a same material and on a same layer as the data line in the power source area;
    a passivation layer disposed on the thin film transistor and formed of organic insulating material, wherein the passivation layer has a drain contact hole exposing the drain electrode and an auxiliary line contact hole exposing one of the auxiliary lines in the power source area, wherein the passivation layer covers ends and/or sides of the one of the auxiliary lines; and
    a first electrode and a line connection pattern on the passivation layer in the pixel region and in the power source area, respectively, wherein the first electrode contacts the drain electrode and the line connection pattern contacts the one of the auxiliary lines.

2. The array substrate according to claim 1, further comprising a bank overlapping edges of the first electrode and a spacer selectively formed on the bank.

3. The array substrate according to claim 1, wherein the passivation layer has a groove exposing the inter insulating layer and another of the auxiliary lines and wherein a seal pattern or a frit pattern fills up the groove and contacts the passivation layer at both sides of the groove.

4. The array substrate according to claim 1, wherein the passivation layer includes one of a photo acryl or benzocyclobutene.

5. The array substrate according to claim 1, further comprising:
    a first storage electrode formed of impurity-doped polycrystalline silicon and on a same layer as the semiconductor layer;
    a second storage electrode formed on the gate insulating layer over the first storage electrode; and
    a third storage electrode formed on the inter insulating layer over the second storage electrode.

6. The array substrate according to claim 1, wherein the semiconductor layer includes a first area corresponding to a central portion and second areas at both sides of the first area, wherein the second areas include impurities therein.

7. The array substrate according to claim 1, further comprising a power source line spaced apart from and parallel to the data line.

8. The array substrate according to claim 1, further comprising a buffer layer between the semiconductor layer and the substrate all over.

9. The array substrate according to claim 1, wherein each of the auxiliary lines and the data line has a triple-layered structure including first, second and third layers, wherein the first and third layers include one of titanium (Ti), molybdenum (Mo) and molybdenum titanium (MoTi), and the second layer includes one of aluminum (Al), aluminum alloy such as aluminum neodymium (AlNd), copper (Cu), and copper alloy.

10. The array substrate according to claim 1, wherein each of the auxiliary lines includes a Vcc signal line, a Vdd signal line, a Vgh signal line, a Vgl signal line or a Vref signal line.

* * * * *